(12) United States Patent
Berens et al.

(10) Patent No.: US 7,386,691 B2
(45) Date of Patent: Jun. 10, 2008

(54) ELECTRONIC DEVICE FOR REDUCING INTERLEAVING WRITE ACCESS CONFLICTS IN OPTIMIZED CONCURRENT INTERLEAVING ARCHITECTURE FOR HIGH THROUGHPUT TURBO DECODING

(75) Inventors: Friedbert Berens, Geneve (CH);
Michael J. Thul, Kaiserslautern (DE);
Franck Gilbert, Kaiserslautern (DE);
Norbert Wehn, Queidersbach (DE)

(73) Assignees: STMicroelectronics N.V., Amsterdam (NL); STMicroelectronics SA, Montrouge (FR)

( * ) Notice: Subject to any disclaimer, the term of this patent is extended or adjusted under 35 U.S.C. 154(b) by 603 days.

(21) Appl. No.: 11/104,836

(22) Filed: Apr. 13, 2005

(65) Prior Publication Data
US 2005/0204262 A1    Sep. 15, 2005

Related U.S. Application Data

(62) Division of application No. 10/325,617, filed on Dec. 20, 2002, now Pat. No. 6,901,492.

(30) Foreign Application Priority Data
Sep. 12, 2002    (EP)    ................... 02292244

(51) Int. Cl.
*G06F 12/00*    (2006.01)
*G06F 13/00*    (2006.01)
(52) U.S. Cl. ..................... 711/157; 711/100; 711/127; 711/154

(58) Field of Classification Search ................ 711/100, 711/127, 154, 157; 370/320, 335, 342
See application file for complete search history.

(56) References Cited

U.S. PATENT DOCUMENTS

| 5,761,695 A | 6/1998 | Maeda et al. ................... 711/5 |
| 2003/0099217 A1 | 5/2003 | Castor et al. ............... 370/335 |

OTHER PUBLICATIONS

Patent abstract: Michael J. Thul et al. of Institute of Microelectronic Systems—University of Kaiserslautern, Germany and Lakshmi Rao of Dept. of Electrical and Computer Engineering—University of California, U.S.A. "Enabling High-Speed Turbo-Decoding Through Concurrent Interleaving".

*Primary Examiner*—Tuan V. Thai
(74) *Attorney, Agent, or Firm*—Lisa K. Jorgenson; Allen, Dyer, Doppelt, Milbrath & Gilchrist, P.A.

(57) ABSTRACT

An electronic device may include a source memory device partitioned into N elementary source memories for storing a sequence of input data sets, and a processor clocked by a clock signal and having N outputs for producing, per cycle of the clock signal, N output data sets respectively associated with the N input data sets stored in the N elementary source memories at respective source addresses. The electronic device may also include N single port target memories, N interleaving tables including, for each relative source address, the number of a target memory and the respective target address thereof, N cells connected in a ring structure. Further, each cell may also be connected between an output of the processor, an interleaving table, and a target memory.

19 Claims, 11 Drawing Sheets

ELECTRONIC DEVICE FOR REDUCING INTERLEAVING WRITE ACCESS CONFLICTS IN OPTIMIZED CONCURRENT INTERLEAVING ARCHITECTURE FOR HIGH THROUGHPUT TURBO DECODING

CROSS-REFERENCE TO RELATED APPLICATION

This is a divisional patent application of U.S. patent application Ser. No. 10/325,617 filed Dec. 20, 2002 now U.S. Pat. No. 6,901,492, the entire disclosure of which is hereby incorporated in its entirety.

FIELD OF THE INVENTION

The present invention relates to the field of wireless communication systems, and, more particularly, to code-division multiple access (CDMA) systems such as CDMA-based mobile radio systems using CDMA 2000, WCDMA (Wide Band CDMA) or the IS-95 standard. The invention relates in general to reducing write access conflicts in interleaving or de-interleaving operations, particularly for high throughput turbo decoding.

BACKGROUND OF THE INVENTION

Turbo codes, which were introduced in 1993, are used in today's communication standards due to their outstanding forward error correction performance. They include concatenated component codes that work on the same block of information bits, which are separated by interleavers. The component codes are decoded individually.

One key to the performance of turbo codes is the iterative exchange of information between the component decoders. The information exchanged iteratively represents the likelihood of the received bit k to have been sent either as $d_k=0$ or $d_k=1$. The decision is represented by the sign of the log-likehood-ratio $$\left(LLR(d_k) = \log\frac{P(d_k-1)}{P(d_k-0)}\right),$$

and the confidence in this decision is represented by its magnitude.

Interleaving involves scrambling the processing order to break up neighborhood relations, and it is important for the performance of turbo codes. The LLR produced at position k, denoted as $LLR(d_k)$, is written to position interleaved(k) in the RAM:

$LLR_{prod}(d_k)LLR_{RAM}(d_{interleaved(k)})$.

The interleaver and deinterleaver tables include one-to-one mappings of source addresses to target addresses. Table 1 shows an example for reordering six LLRs to perform interleaving.

TABLE 1

Interleaver/Deinterleaver Table for six LLRs.

| Address | Interleaved | Address | Deinterleaved |
|---|---|---|---|
| 1 | 3 | 1 | 6 |
| 2 | 6 | 2 | 4 |
| 3 | 5 | 3 | 1 |
| 4 | 2 | 4 | 5 |
| 5 | 4 | 5 | 3 |
| 6 | 1 | 6 | 2 |

Deinterleaving brings these items into the original sequence again (a 3GPP compliant table, for example, would include up to 5114 entries). One LLR has to be read for every LLR produced. If only one LLR is produced per time step, interleaving may be performed on the fly through indirect addressing. However, high-throughput applications require parallel architectures that produce more than one LLR per time step. Thus, multiple LLRs have to be read and written concurrently. The number of LLRs read and written will be denoted herein as N.

In a 0.20 μm technology, a single producer may achieve a maximum throughput of about 7 Mbit/s assuming 10 iterations. For 100 M bit/s, a reasonable assumption for future communication systems, N=16 producers would be necessary, requiring 16-port RAMs. Yet, the use of N-port RAMs to solve access conflicts is, in general, not feasible.

Read access conflicts may be avoided by using N individual memories. Write access conflicts may not be avoided that easily. That is, the positions where the produced LLRs have to be stored depend on the interleaver. For arbitrary interleavers, the target memory, i.e., the RAM to which each LLR has to go to, is not known at design time. At each time step and for each RAM, the number of LLRs to be stored may vary from 0 to N. The resulting concurrent accesses to the same single port memory are thus a significant bottleneck in high throughput turbo decoding.

The problem is perhaps best illustrated by taking the interleaver table of Table 1 for two concurrently produced LLRs and assigning its addresses to two individual RAMs. Table 2 shows the interleaver table entries together with the associated RAMs and relative addresses. It should be noted that only the interleaver will be mentioned hereafter, but the same concepts apply to the deinterleaver as well.

TABLE 2

Interleaver Table with associated RAMs.

| Source RAM | Relative Address | Address | Interleaved | Target RAM | Relative Address |
|---|---|---|---|---|---|
| =>1 | 1 | 1 | 3 | 1 | 3 |
| 1 | 2 | 2 | 6 | 2 | 3 |
| 1 | 3 | 3 | 5 | 2 | 2 |
| =>2 | 1 | 4 | 2 | 1 | 2 |
| 2 | 2 | 5 | 4 | 2 | 1 |
| 2 | 3 | 6 | 1 | 1 | 1 |

The number of write accesses may be determined from the interleaver tables and the producing scheme. Assuming that the two LLRs are produced in order of ascending relative addresses (i.e. in the first time step at the absolute addresses 1 and 4) and interleaving is performed according to Table 2, and Table 3 shows the resulting write accesses.

TABLE 3

Write Accesses to LLR RAMS

| Time step | Write Accesses to RAM 1 | Write Accesses to RAM 2 |
|---|---|---|
| 1 | 2 | 0 |
| 2 | 0 | 2 |
| 3 | 1 | 1 |

In the first time step, for example, one LLR is read from source RAM1 (Address 1) and written to target RAM1 (Address 3). The other one is read concurrently from source RAM2 (Address 1) and written to target RAM1 (Address 2), which results in two concurrent write accesses for target RAM1.

In A. Giuletti, L. Van Der Perre, M. Strum., *Parallel turbo coding interleavers: avoiding collisions in accesses to storage elements*, IEEE Electronics Letters Vol. 38, No. 5, February 2002, a dedicated interleaving scheme for each given architecture and block size is derived, circumventing the arising access problems. This approach does not, however, allow for pre-defined interleavers, as for example in a standard like 3GPP, nor for arbitrary block lengths or degrees of parallelization. Other prior art approaches use one fixed interleaver implemented through wired connections between component decoders.

SUMMARY OF THE INVENTION

An object of the invention is to provide an architecture capable of performing concurrent interleaving.

One such architecture in accordance with the present invention performs concurrent rather than sequential interleaving, thus widening the interleaver bottleneck and enabling parallelized high-speed turbo decoders, which produces more than one LLR per time step. This architecture is, moreover, independent of any interleaver design or access scheme deployment.

This architecture is based on a single LLR distributor to determine the target RAM and addresses for all the N incoming data. N associated data sets made up of incoming data and local addresses are formed. An additional "relevant-or-not" signal is given to each buffer for each data set. Every buffer thus has access to all data sets, from which each buffer selects those which are aimed at its local target RAM. A tree-like structure is used with the LLR distributor functioning as a root and the buffers associated with target RAMs as leaves.

More particularly, an electronic device implementing the above architecture may include a source memory or means partitioned in N elementary source memories for storing a sequence of input data sets. Further, a processor or means is clocked by a clock signal and may have N outputs for producing N data sets per cycle of the clock signal. The N data sets are respectively associated with N input data sets, which are respectively stored in the N elementary source memories at relative source addresses. The electronic device may further include N single port target memories, N interleaving tables including, for each relative source address, the number of one target memory and the corresponding relative target address therein, and N cells.

In particular, each cell is connected between the N outputs of the processor, the N interleaving tables, and the port of one target memory. Each cell may receive data sets from the N outputs of the processor to select up to N received data sets based upon the contents of the interleaving tables, and to write the selected data sequentially in the associated target memory.

Moreover, the single LLR distributor preferably functionally includes a part of each cell, i.e., the sorter or means which permits the selection from among the data sets received by a cell those which are relevant for the cell and are to be stored in the target memory connected to the cell. Of course, in some cases none of the N received data may be selected. This would occur when the N received data sets are to be stored in other memories than the target memory connected to this cell.

More generally, each cell may include a sorting buffer or means connected to the N outputs of the processor, to the N interleaving tables, and to the corresponding target memory. The sorting buffers are for receiving N data sets with their associated target memory number and the associated relative target address, selecting from the N data sets those having an associated target memory number identical to the target memory number connected to the cell, and delivering them sequentially to the target memory.

More particularly, each sorting buffer may include a sorter or sorting means having N inputs forming the inputs of the sorting buffer, N outputs, and control inputs or means for receiving the associated target memory numbers. In addition, the sorter may select from the data sets received at its N inputs those having an associated target memory number identical with the target memory number connected to the cell, and deliver the selected data to consecutive outputs. Each sorting buffer may further include a register or means including a predetermined number of elementary registers. Each elementary register may store selected data along with its relative target address. Each sorting buffer may also include a writing pointer or means for writing the selected data sets in consecutive elementary registers before being shifted by the number of values actually written, and a reading pointer or means for sequentially reading the elementary registers.

For a large value of N, the critical path of this architecture is in the LLR distributor and increases with increasing N. Moreover, the buffers themselves are capable of storing multiple inputs in one cycle. Such buffers have been developed, but their intrinsic complexity grows exponentially with the number of inputs. The number of registers in each buffer has a minor role. An optimization based on two stages of buffers (i.e., based on a dual stage reading pointer) permits limiting the number of inputs per buffer.

A more detailed but non-limiting example of the architecture described above has been presented in M. J. Thul, N. Wehn, and L. P. Rao., Enabling High-Speed Turbo-Decoding Through Concurrent Interleaving, *Proc.* 2002 *IEEE International Symposium on Circuits and Systems* (IS-CAS'02), Phoenix, Ariz., USA, May 2002.

Although the above-noted electronic device according to the invention offers several advantages, the interconnect problem may still be significant in a multi-stage approach because the LLR distributor spans the whole chip. Design of such a far spread component is a challenge that is hard to meet using current design methodologies. Moreover, as noted above, each buffer communicates with the LLR distributor through N data sets and corresponding validity signals. This leads to extensive top level routing. Thus, this architecture may have negative interconnect implications in deep sub-micron technologies.

The main communication basically takes place on a shared medium with a very high load, making each data transfer an expensive broadcast. Such broadcasts may cause performance and power bottlenecks.

The problems of distributed logic and broadcasted communication may advantageously be addressed in accordance with the invention by designing another concurrent interleaving architecture based on point-to-point interconnected nodes. One reason for this approach is to resolve the write access conflicts without increasing the overall latency. Further, any arbitrary number of soft values produced may be handled, and the architecture may be distributed to smoothly fit into the overall decoder design.

Such an electronic device may include a source memory or means partitioned in N elementary source memories for storing a sequence of input data sets, and a processor or processing means clocked by a clock signal and having N outputs for producing, per cycle of the clock signal, N data sets respectively associated with N input data sets stored in the N elementary source memories at respective source addresses. The electronic device may further include N single-port target memories, N interleaving tables including, for each relative source address, one target memory number and the corresponding relative target address therein, and N cells connected in a ring structure.

Each cell may be further connected between one output of the processor, one interleaving table, and the port of one target memory. Each cell may receive data sets from the output of the processor and from its two neighboring cells, and dispatch at least some of the received data sets to at least one of the two neighboring cells They may also write at least some of the received data sets sequentially in the associated target memory, in accordance with the contents of the interleaving tables.

In other words, such an interconnect-driven design approach according to the present invention leads to simplified local interleaver cells with almost negligible control flow. No global routing nor global control is necessary.

In particular, each cell may include a distributor or distribution means connected to the corresponding output of the processor, to the corresponding interleaving table, and to the two neighboring cells. The distributor may be for receiving generated data respectively associated with target information containing the corresponding number of the target memory and the corresponding relative target address. It may also be for delivering the generated data associated with the target information, together with corresponding direction information.

Each cell may also include a sorting buffer or means connected to the distributor, to the corresponding target memory, and to the two neighboring cells for receiving the corresponding data associated with the data target information and the corresponding direction information. The sorting buffer may also select from the data sets those which are to be passed through in accordance with the corresponding direction information, and deliver them sequentially.

The distributor may include a local distributor connected to the corresponding output of the processor and to the corresponding interleaving table for receiving generated local data associated with target information, and for delivering the generated local data associated with its target information together with direction information. The distributor may further include a right-in distributor for receiving right-in data with associated target information delivered by the right neighboring cell, and for delivering the right-in data and associated target information together with direction information. It may also include a left-in distributor for receiving left-in data with associated target information delivered by the left neighboring cell, and for delivering the left-in data and associated target information together with direction information.

In addition, the sorting buffer may include a local out sorting buffer having three inputs respectively connected to the local, right-in and left-in distributors, and an output connected to the port of the corresponding target memory. The sorting buffer may receive the corresponding data sets with associated target information and corresponding direction information. The sorting buffer may also select from these data sets those which are to be stored in the target memory based upon the corresponding direction information, and write the selected data sequentially in the target memory based upon the relative target addresses thereof.

The sorting buffer may further include a left-out sorting buffer having two inputs respectively connected to the local and right-in distributors, and an output connected to the right-in distributor of the left neighboring cell. The left-out sorting buffer may be for receiving the corresponding data with associated target and direction information, selecting data sets to be delivered to the right in distributor of the left neighboring cell therefrom in accordance with the direction information, and sequentially delivering the selected data sets and associated target information.

Also, the sorting buffer may additionally include a right-out sorting buffer having two inputs respectively connected to the local and left-in distributors, and an output connected to the left-in distributor of the right neighboring cell. The right-out sorting buffer may be for receiving the corresponding data with associated target and direction information, selecting data sets therefrom to be delivered to the left-in distributor of the right neighboring cell in accordance with the direction information, and sequentially delivering the selected data sets and associated target information.

Each sorting buffer may also advantageously include a sorter or sorting means for sorting based upon reference direction information. The sorter may have inputs forming the inputs of the sorting buffer, a number of outputs equal to the number of inputs, and control input or means for receiving the direction information. The sorter may select from the data sets received at its inputs data sets having associated direction information identical with the reference direction information, and it may deliver the selected data sets to consecutive outputs.

The sorting buffer may also include a register or means including a predetermined number of elementary registers, each elementary register for storing selected data sets and associated target information. The sorting buffer may further include a writing pointer or means for writing the selected data sets in consecutive elementary registers before being shifted by the number of values actually written, and a reading pointer or means for sequentially reading the elementary registers.

The electronic device according to the invention may advantageously be implemented in an integrated circuit. Furthermore, another aspect of the invention relates to a code-decoder or a code-encoder including an electronic device as set forth above. For example, the code decoder may be a turbo code decoder. A further aspect of the invention relates to a component for a wireless communications system including a code decoder as set forth above. Such a component may be a cellular mobile phone or a base station, for example.

BRIEF DESCRIPTION OF THE DRAWINGS

Other advantages and features of the invention will become apparent upon examining the detailed description of embodiments thereof, given by way of non-limiting example, with reference to the appended drawings, in which.

DETAILED DESCRIPTION OF THE PREFERRED EMBODIMENTS

Figure 1:
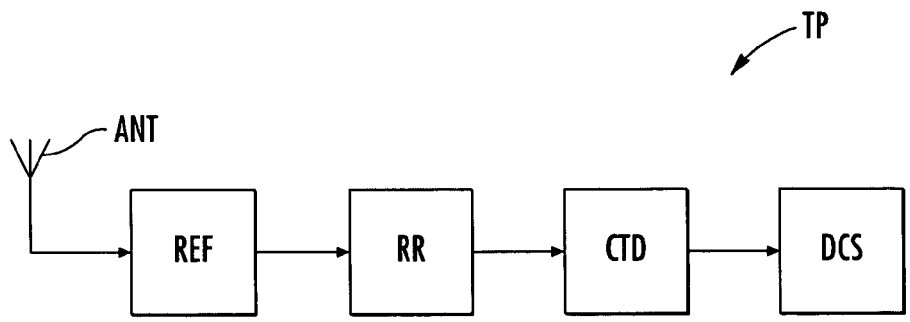
FIG. 1 is a schematic block diagram of a receiving chain of a cellular mobile phone including an electronic device according to the invention.

Turning now to FIG. 1, a turbo decoder according to the invention is incorporated in the reception chain of a cellular mobile phone TP, although the invention is not limited to this particular application. The encoded signal is received by the antenna ANT and processed by the radio frequency stage REF of the receiver. At the output of the REF stage, the signal is converted into the digital domain by an A/D converter. The digital base band signal is then processed by a "rake" demodulator RR which is used generally in the case of a CDMA system. The channel decoding stage includes a turbo code decoder CTD in accordance with the invention. The processing chain also include a source decoding block DCS, which performs the source decoding treatments.

The third generation mobile radio system specifies convolutional codes as well as turbo codes as channel coding techniques. See 3GPP, Technical Specification Group Radio Access Network; Multiplexing and channel coding (FDD); (3G TS 25.212 version 3.5.0(2000-12)), Release 1999. In turbo code encoders, forward error correction is enabled by introducing parity bits. For turbo codes, the original information, denoted as systematic information, is transmitted together with the parity information. The encoder for 3GPP includes two recursive systematic convolutional (RSC) encoders with constraint length K=4, which may also be interpreted as 8-state finite state machines. The first RSC encoder works on the block of information in its original, the second one in an interleaved sequence.

On the receiver side, there is a corresponding component decoder for each RSC encoder. Each component decoder implements, for example, a so-called maximum-a-posteriori (MAP) algorithm, and is usually a soft-in-soft-out (SISO) decoder.

Each block of information is decoded in an iterative manner. The systematic information and the parity information serve as inputs of the first component decoder (MAP1). The soft output of MAP1 reflects its confidence on the received bits of being sent either as 0 or 1. These confidences are interleaved in the same manner as in the encoder and passed to the second component decoder (MAP2) as a priori information. The second component decoder uses this information to bias its estimation comprising the interleaved systematic information and the parity information of the second encoder. The soft outputs are again passed on to MAP1, and so on. The exchange continues until a stop criterion is fulfilled. Stop criteria range from simple cases, such as "fixed number of iterations" over cyclic redundancy check (CRC) to rather complex statistical analysis.

Implementation issues for turbo decoder architectures using the MAP algorithm have already been discussed in several papers and are well known. See, e.g., A. Worm, *Implementation Issues of Turbo-Decoders*, Phd thesis, Institute of Microelectronic Systems, Departement of Electrical engineering and Information Technology, University of Kaiserslautern, Forschungsberichte Mikroelektronik, Bd.3, Germany, 2001.

The MAP algorithm is transformed into the logarithmic domain to reduce operator strength. See P. Robertson, E. Villebrun and P. Hoeher: *A comparison of Optimal and Sub-Optimal MAP decoding Algorithms Operating in the Log-Domain*; Proc. 1995 International Conference on Communications (ICC'95), June 1995, Seattle, Wash., USA. Multiplications become additions, and additions are replaced by a modified comparison. It includes a forward recursion, a backward recursion and soft-output calculation.

Decoding turbo codes by searching the most likely codeword is far too complex. Therefore, iterative decoding is advised. The two convolutional codes are decoded separately. While doing this, each decoder incorporates information that has been gathered by the other. This "gathering of information" is the exchange of soft output values, where the bit estimates of one unit are transformed into a priori information for the next. The decoders hence have to be SISO units.

The confidence in the bit estimation is represented as a Log-Likelihood-Ratio (LLR):

$$L(d_k) = \ln \frac{P(d_k = 1)}{P(d_k = 0)}.$$

The sign shows whether this bit is supposed to be one or zero, whereas the confidence in the decision is represented by the magnitude.

To extract the information that has been gathered during the last decoding stage, the systematic and a priori information that lead to this estimate has to be subtracted. This yields:

$$L^1(d_k) = L^1(d_k) - y_k^s - L_{deint}^2(d_k); \text{ and}$$

$$L^2(d_k) = L^2(d_k) - y_k^s - L_{int}^1(d_k).$$

This is called the extrinsic information. The confidence of one decoder in a bit to have a certain value biases the initial guess of the other.

Figure 2:
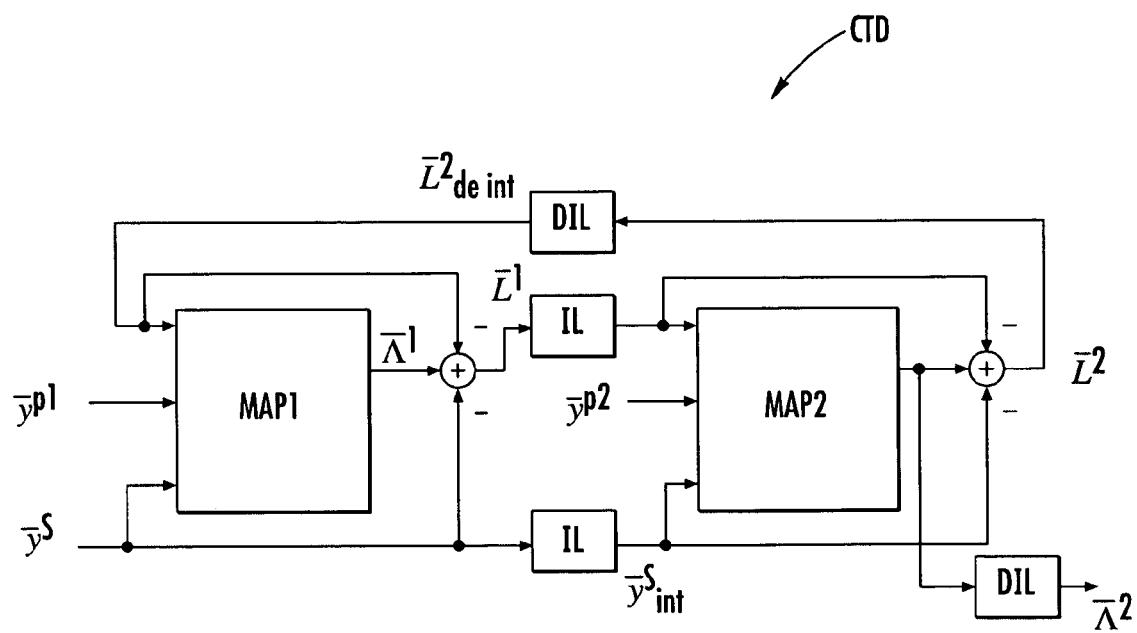
FIG. 2 is a schematic block diagram of a turbo decoder including an electronic device according to the invention.

FIG. 2 shows such a turbo code decoder CTD including two MAP decoders, interleaving means IL and de-interleaving means DIL. Feeding the input of one decoder as a priori information input to the next enables the improvement over the decoding iterations. It also gave turbo codes their name, as it resembles the "feedback of exhaust" used in combustion turbo engines. Inputs to the decoder are the received channel values (systematic, parity1 and parity2). During the very first MAP1 operation, the a priori information is set to zero.

Figure 3:
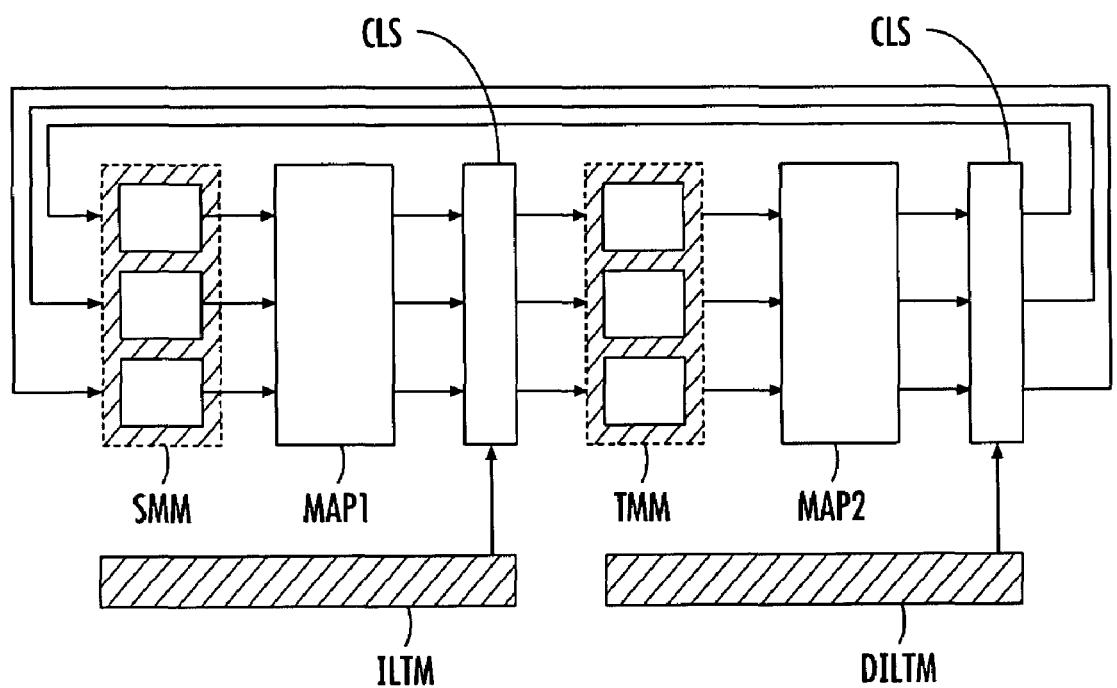
FIG. 3 is a schematic block diagram of an electronic device according to a first embodiment of the invention incorporated in a turbo code decoder.

In addition to the SISO decoders MAP1 and MAP2, memories are needed to store the input and output values, in particular for the interleaver and deinterleaver pattern. FIG. 3 shows diagrammatically some of these memories. More precisely, on this example which illustrates a first embodiment of the invention, the MAP1 unit, as well as the MAP2 unit, is a multiLLR producer which has N outputs (here N=3). It produces, per cycle of the clock signal which clocks the MAP unit, N data (here N LLR) respectively associated to N input data respectively stored in N elementary source memories which form the source memory means SMM.

A structure CLS of N cells is connected to the N outputs of the MAP1 unit as well as to interleaving table means formed by N interleaving tables. After having passed through the structure CLS, the N produced data (here, the N produced LLR) are stored in target memory means TMM formed by N target memories. Each of the source memory and the target memory is a single port memory.

For the MAP2 unit, the target memory means TMM act as source memory means, and the source memory means SMM of the MAP1 unit act as target memory means for the MAP2 unit. Further, the interleaving table means is replaced by deinterleaving table means DILTM.

Generally speaking, an electronic device according to the first embodiment of the invention includes processing means (here, the MAP1 unit, for example), source memory means SMM, the structure CLS, the interleaving table means ILTM, and the target memory means TMM.

The structure and the operation of an electronic device according to the first embodiment of the invention will be now described in more detail with reference to FIGS. 4-7. Although the electronic device is described by using interleaving table means, it is clear that the same concept applies to deinterleaving table means which may also be considered interleaving table means.

Figure 4:
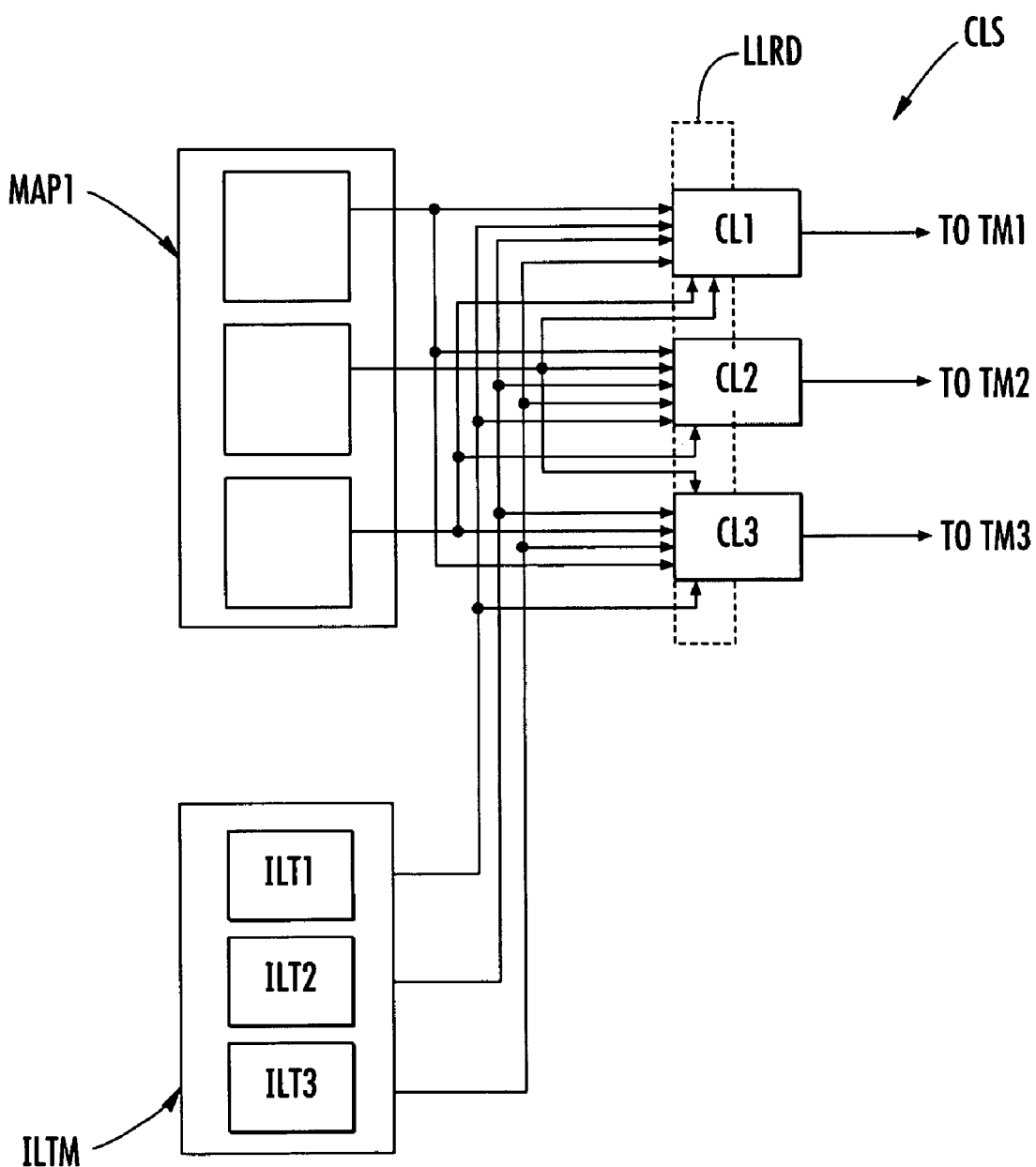
FIG. 4 is a schematic block diagram showing in greater detail a portion of the electronic device of FIG. 3.

As illustrated in more detail in FIG. 4, in which N is equal to 3, each cell CLi of structure CLS is connected between the N outputs of the processing means MAP1, the N interleaving table ILTi and the port of one target memory TMi. Generally speaking, each cell receives data from the N outputs of the processing means to select up to N received data in accordance with the contents of the interleaving tables. Each cell also writes the selected data sequentially in the associated target memory.

Each interleaver table ILTi comprises, for each relative source address of one source memory, the relative target address of a corresponding target memory as well as the number of this target memory. The number of the target memory and the corresponding relative target address therein constitute target information for associated data (LLR).

According to this first embodiment of the invention, each cell comprises sorting buffer means connected to the N outputs of the processing means, to the N interleaving tables and to the corresponding target memory. The sorting buffer means is for receiving N data with associated target memory numbers and relative target addresses, selecting from the N data those having an associated target memory number identical to the target memory number associated with to the cell, and delivering the selected data sequentially to the target memory. Of course, it is possible that during one time step the sorting buffer means of a cell does not select any data, and consequently does not deliver any data to the corresponding target memory.

Figure 5:
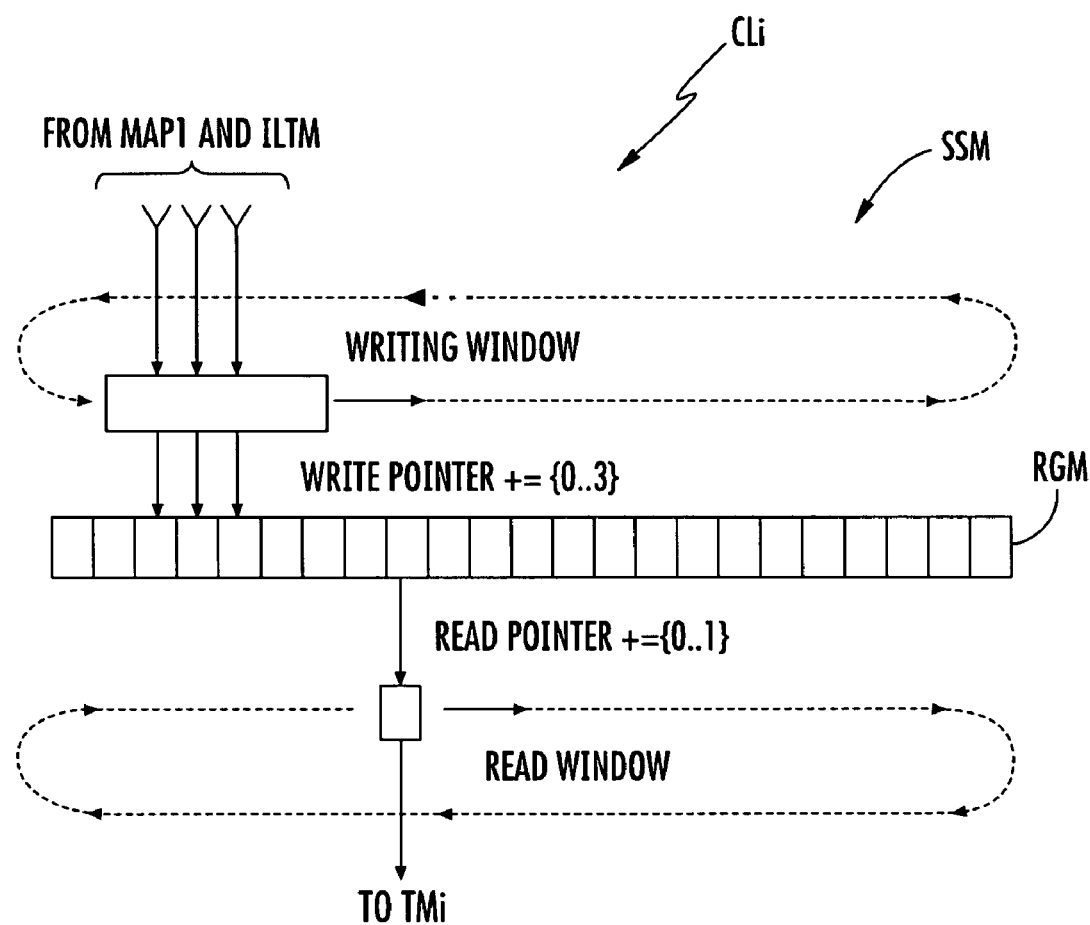
FIGS. 5 and 6 are schematic block diagrams showing in greater detail buffer circuitry incorporated in the electronic device of FIG. 3.

As illustrated more particularly in FIG. 5, the sorting buffer means of a cell CLi comprises sorting means SMM and register means RGM. As illustrated diagrammatically in FIG. 4, all the sorting means SMM of all the cells CLi together form a single LLR distributor referenced LLRD.

Figure 6:
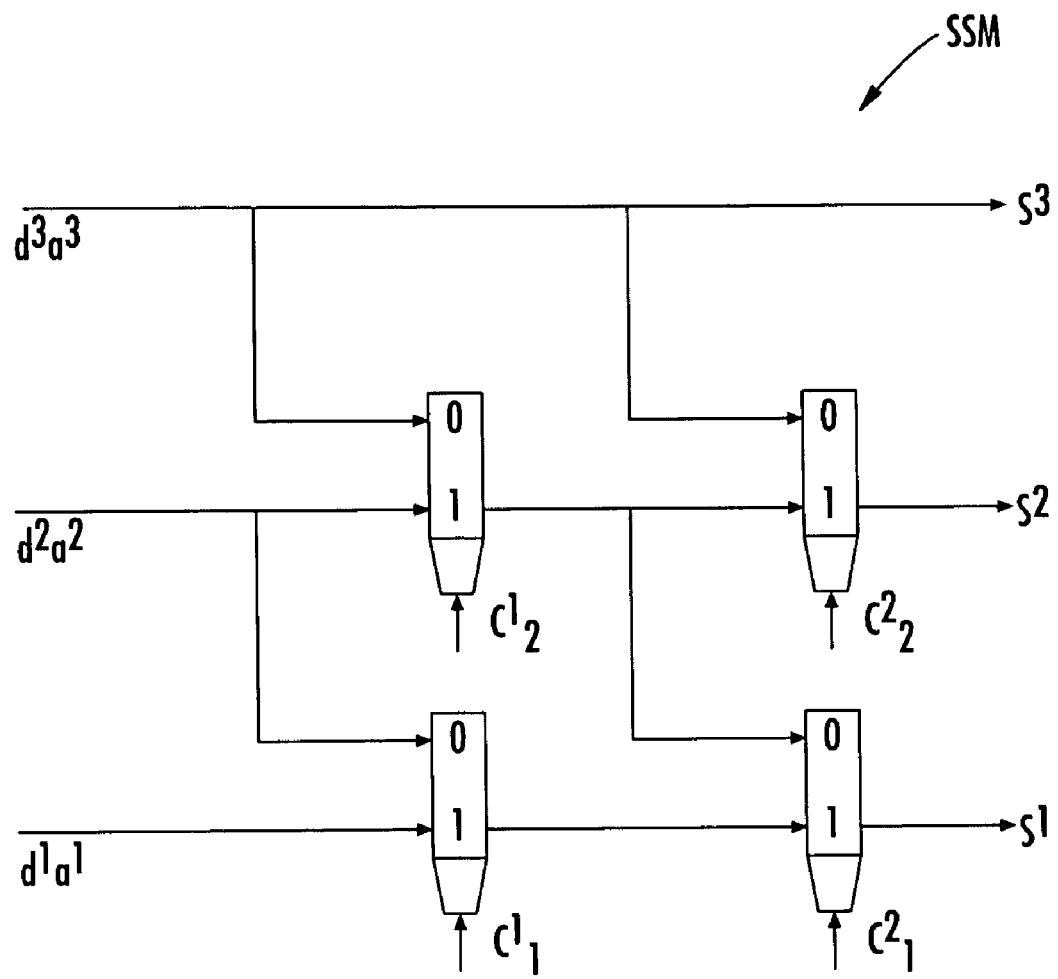

Referring now to FIGS. 5 and 6, one embodiment of a sorting buffer means of a cell Cli will be described in further detail. Because in the illustrated example N is equal to three, three data are received on the three inputs of the sorting buffer means. However, none of those, or some of those or all the N data, have to be stored in the local target RAM TMi, depending on their target information and, more particularly, on their associated target memory number. Further, the N data is received in the same clock cycle. However, only one datum may be stored per cycle in the target RAM TMi.

Thus, such a buffer should be able to store N values and output one value to memory in the same cycle. Such a buffer does not need to support random access. It is implemented as a special register file capable of storing up to N values in parallel. A value is composed here of a LLR data with its associated target information, including the associated relative address.

Write and read accesses to a buffer may be modeled with writing windows, where values may be stored in registers and reading windows. The writing window contains N registers, the worst case number of concurrent write accesses. Shifting it only by the number of values actually written prevents the creation of "holes" with irrelevant values.

FIG. 6 illustrates diagrammatically one embodiment of the sorting means SMM buffer, still assuming that N is equal to 3. The sorting means comprises here two stages of two multiplexers controlled by control signals $C_j^k$. When a control signal takes the value 1, the data received at the input 1 of the multiplexer is delivered at the output. By analogy, when a control signal takes the value 0, the data received at the input 0 is delivered at the output of the multiplexer.

The sorting means SSM are associated with the number of the target memory which is actually connected to the cell CLi. When data arrives at the input of the sorting means SSM, its associated number of target memory is compared with the number of the target memory which is actually connected to the cell CLi. If these two numbers are identical, a decision variable $r^x$ is associated with the data and takes the value 1, for example. In the contrary, the decision variable $r^x$ takes the value 0.

Control means, realized by logic gates, then generates the following control signals:

$C^1_1 = r^1$;
$C^1_2 = r^1$;
$C^2_1 = r^2$ or $r^1$; and
$C^2_2 = r$.

Thus, from the inputs, only those which are relevant for this buffer are selected and aligned such that they form an uninterrupted sequence starting from $s^1$, for example. These sorted sequences and the total number of relevant inputs (R) is passed to the register means RGM. The output $s^1$ to $S^R$ are stored in the register means RGM. This ensures a continuous filling of the register means RGM of relevant data only.

Figure 7:
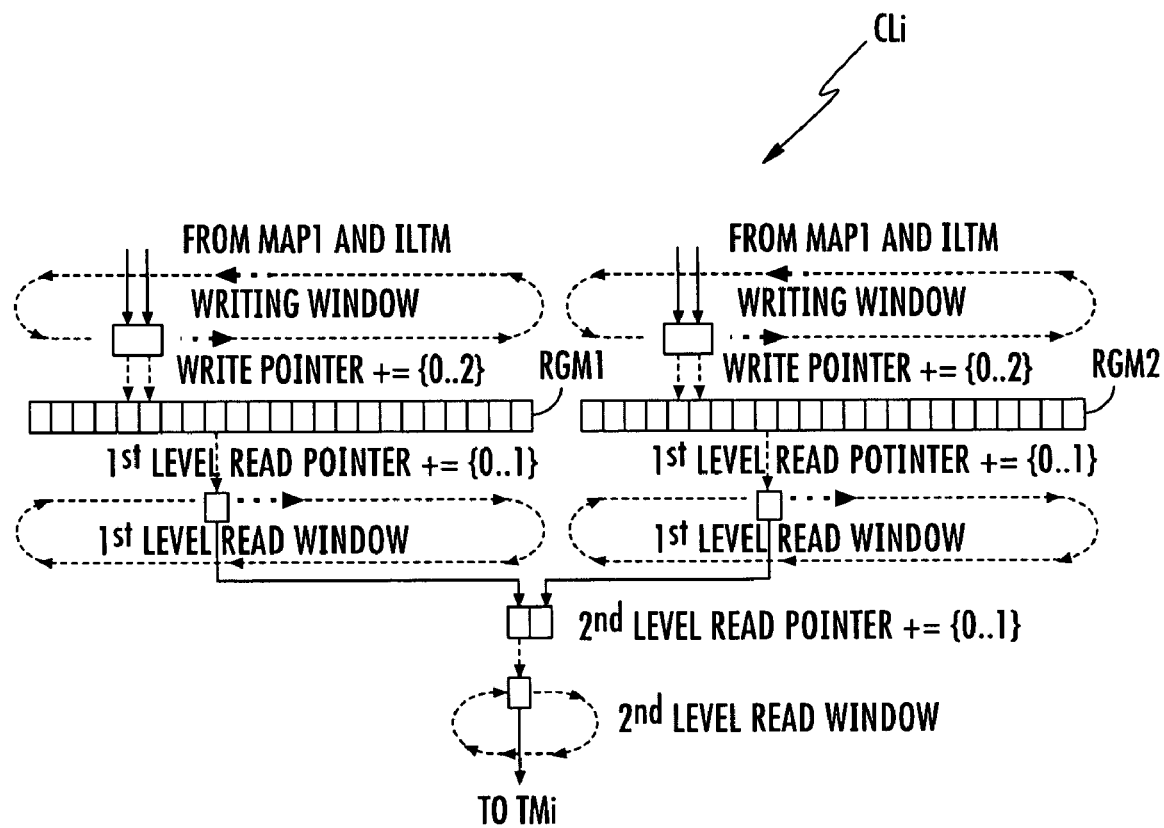
FIG. 7 is a schematic block diagram showing in greater detail a sorting buffer with a dual stage reading pointer of the electronic device of FIG. 3.

When reading from the register means RGM, the local address a and the data d are separated again and used to address the local target RAM accordingly. An optimization based on two stages of buffers limits the number of inputs per buffer. Such an embodiment based on a dual stage reading pointer means is illustrated in FIG. 7, where N is equal to 4. The register means comprises here two registers RGM1 and RGM2. The access scheme for the second level reading window should provide balanced emptying of the first level buffers. A cyclic reading of those buffers which are not empty is used.

Figure 8:
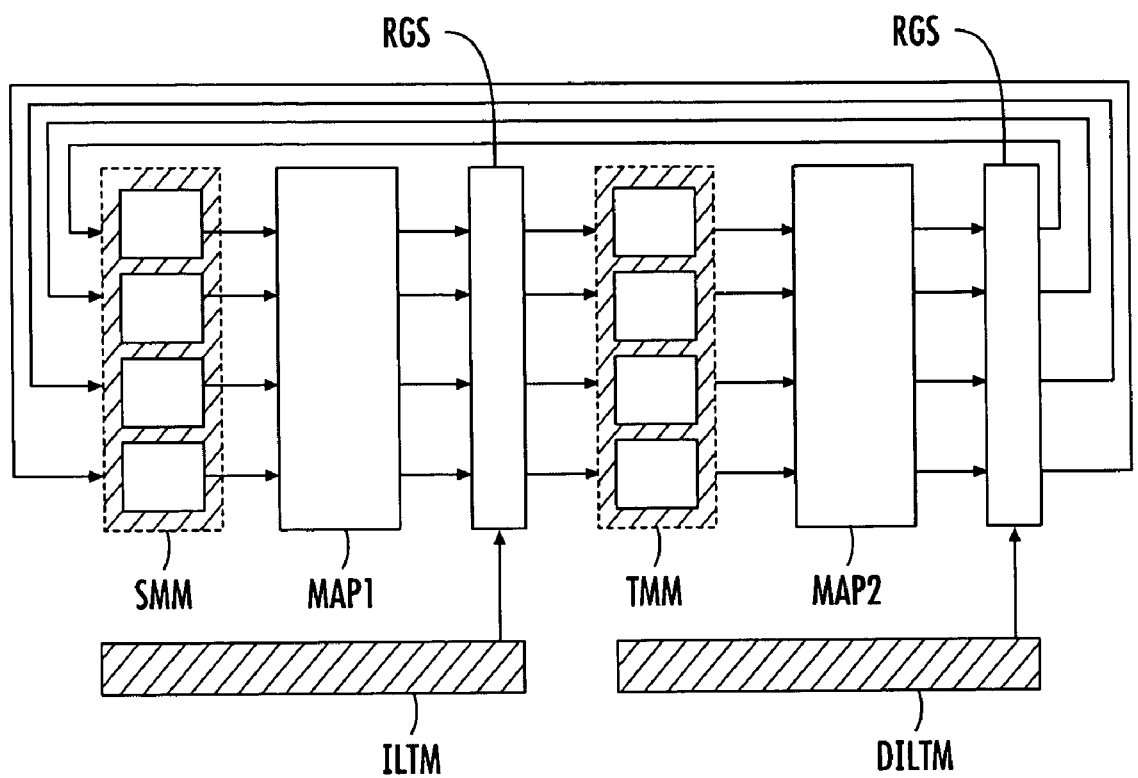
FIG. 8 is a schematic block diagram of an electronic device according to a second embodiment of the invention incorporated in a turbo code decoder.

Turning now to FIGS. 8-12, a second embodiment of an electronic device according to the invention is now described. Turning first to FIG. 8, the MAP1 unit, as well as the MAP2 unit, is a multi-LLR producer which has N outputs (here N=4) for producing, per cycle of the clock signal which clocks the MAP unit, N data (here N LLR) respectively associated with N input data. The N input data is respectively stored in N elementary source memories which form source memory means SMM.

N cells connected in a ring structure RGS are connected to the N output of the MAP1 unit as well as to interleaving table means formed by N interleaving tables. After having passed through the ring structure RGS, the N produced data (here, the N produced LLR) are stored in target memory means TMM formed by N target memories. Each of the source memory and the target memory is a single port memory.

For the MAP2 unit, the target memory means TMM act as source memory means. The source memory means SMM of the MAP1 unit acts as target memory means for the MAP2 unit. Further, the interleaving table means is replaced by deinterleaving table means DILTM. Generally speaking, an electronic device according to the second embodiment of the invention comprises processing means (here, the MAP1 unit, for example) source memory means SMM, the ring structure RGS, the interleaving table means ILTM, and the target memory means TMM.

The structure and the operation of such an electronic device will be now described in greater detail. Further, as for the first embodiment, although the electronic device is described by using interleaving table means, it is clear that the same concept applies to deinterleaving table means which may be applicable to interleaving table means as well.

Figure 9:
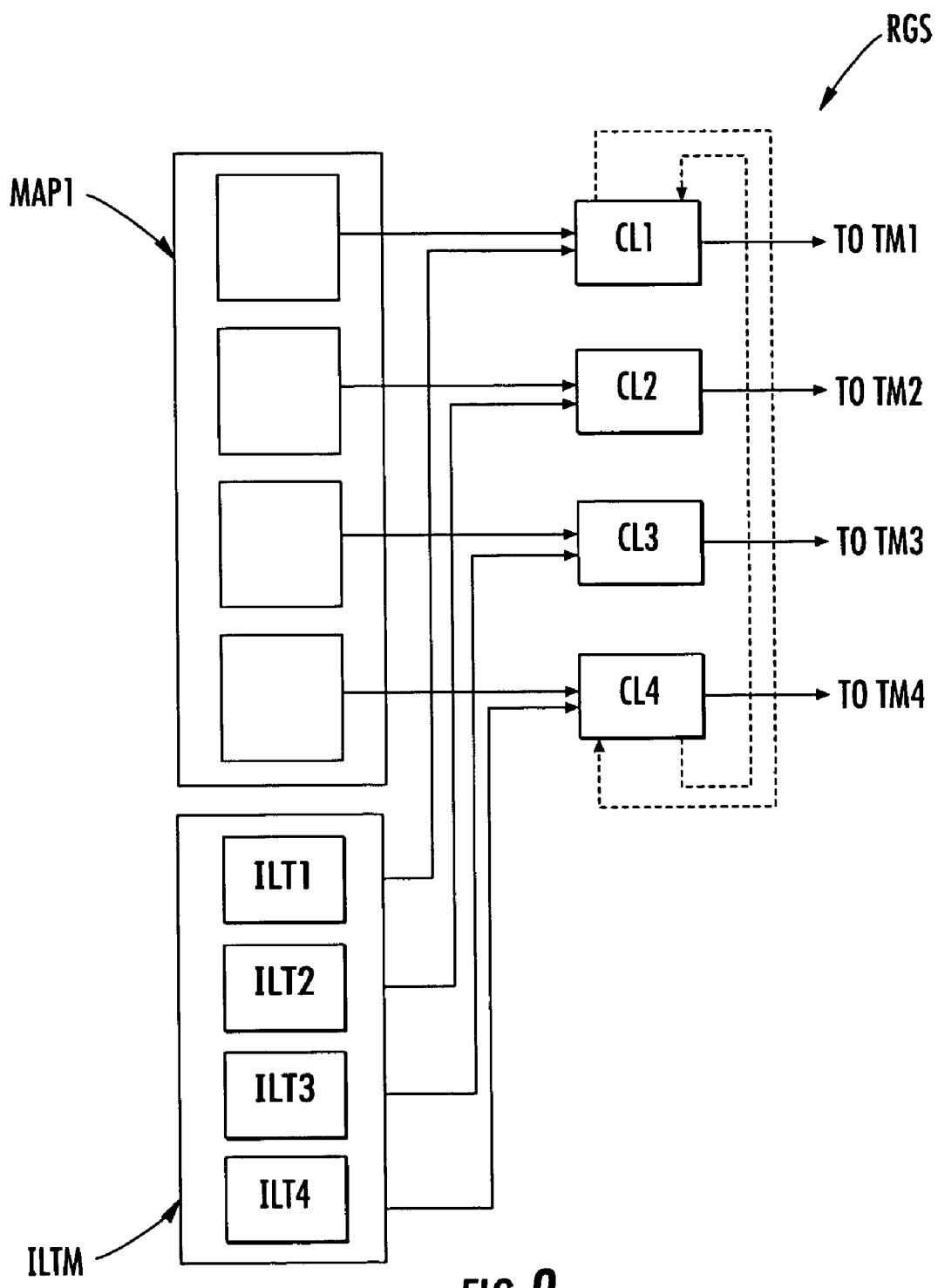
FIG. 9 is a schematic block diagram showing in greater detail a portion of the electronic device of FIG. 8.

As illustrated in FIG. 9, in which N is equal to 4, each cell CLi of the ring structure RGS is connected between one output of the processing means MAP1, one interleaving table ILTi and the port of one target memory TMi. Generally speaking, all the cells receive data from the respective outputs of the processing means and from their two respective neighboring cells. They also dispatch at least some of the received data to at least one of the two respective neighboring cells, or respectively write at least some of these received data sequentially in the associated target memories, in accordance with the contents of the interleaving tables.

Each interleaver table ILTI comprises, for each relative source address of one source memory, the relative target address of a corresponding target memory as well as the number of this target memory. The number of the target memory and the corresponding relative target address therein form target information associated with the data (LLR).

Figure 10:
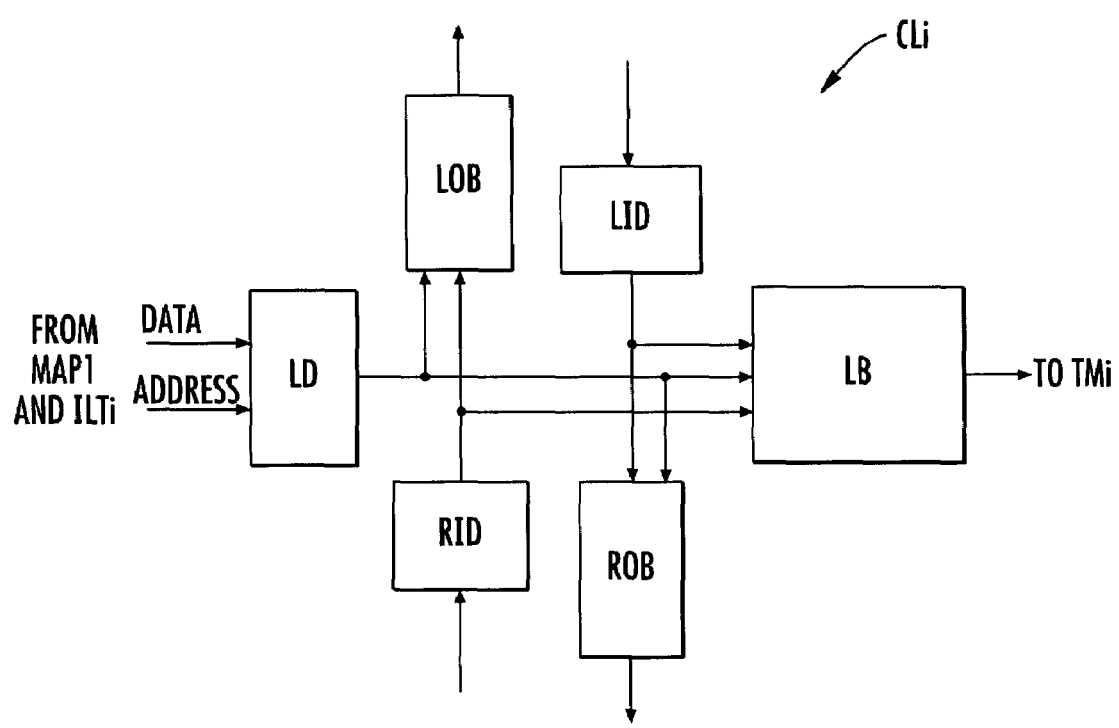
FIG. 10 is a schematic block diagram showing in greater detail a local cell incorporated in the electronic device of FIG. 8.

As illustrated more particularly in FIG. 10, a cell CLi comprises distribution means (LD) connected to a corresponding output of the processing means MAP1 and to the corresponding interleaving table, and also distribution means (RID, LID) connected to the two neighboring cells. The distribution means receive generated data respectively associated with their target information. The distribution means will then deliver the generated data associated with the target information together with corresponding direction information.

Further to the distribution means, each cell also comprises sorting buffer means LB, LOB, ROB, connected to the distribution means, but also to the corresponding target memory and to the two neighboring cells. Generally speaking, sorting buffer means are adapted to receive the corresponding data associated with their target information and their corresponding direction information, to select from this data that which is to be passed through in accordance with the corresponding direction information, and delivering this data sequentially.

Turning now again to the distribution means, as illustratively shown in FIG. 10 the distribution means comprises a local distributor LD connected to the corresponding output of the processing means MAP1 and to the corresponding interleaving table. The local distributor receives generated local data associated with its target information and including the corresponding number of the target memory and the corresponding relative target address therein.

This local distributor LD of the cell CLi has only to decide whether the incoming data is stored in the target RAM TMi connected to the cell CLi, or has to be sent left or right. The direction for non-local data is determined based on the shortest path to the target RAM.

The local distributor, which is formed, for example, by a logic circuit, delivers the received data with its target information and generates a direction information for this data. This direction information is, for example, a word of two bits. For example, the values (0,0) means "go ahead" to the target RAM TMi. The values (0,1) means "go left" whereas the values (1,0) means "go right".

A look-up table (not shown) is associated with the cell and includes a mapping of the different values of the direction information and the numbers of the different cells (i.e., the numbers of the different target memories). When data arrives, the local distributor LD compares the number of the corresponding target memory associated with this data with the contents of the look-up table to generate corresponding direction information.

Two additional distributors are necessary in each cell for the left and right inputs. More precisely, the distribution means of the cell Cli comprises a right-in distributor RID and a left-in distributor LID. The right-in distributor receives right-in data delivered by the right neighboring cell with associated target information. The right-in distributor delivers the right-in data with associated target information and direction information. The direction information is also generated using the look-up table. By analogy, the left-in distributor LID receives left-in data delivered by the left neighboring cell and for delivering the left-in data with associated target information together with direction information.

As illustrated in FIG. 10, data received by the local distributor LD may be stored in the local target memory TMi or be sent left or right. By analogy, data received by the right-in distributor may be stored to the local target RAM TMi or be sent to the left neighboring cell. Data received by the left-in distributor LID may be stored in the local RAM TMi or be sent to the right neighboring cell.

The sorting buffer means comprises a local out sorting buffer LB having three inputs respectively connected to the local, right-in and left-in distributors. The local out sorting buffer LOB also has one output connected to the port of the local target memory TMi. The local out sorting buffer LD receives the corresponding data associated with the target information and the corresponding direction information. It selects therefrom data to be stored in the target memory TMi in accordance with the corresponding direction information, and it writes this data sequentially in the target memory in accordance with the relative destination addresses.

In the present case, the local out buffer LB may receive 0, 1, 2, or 3 sets of data in one clock cycle, to be stored in the local target RAM. In other words, as several data sets may have the same target, the local buffer should be capable of storing more than one data set per cycle and to deliver them sequentially one data set per cycle. A specific architecture for such a buffer will be described further below.

The left-out sorting buffer LOB receives the corresponding data associated with the target information and the direction information thereof to select data to be delivered to the right-in distributor of the left neighboring cell in accordance with their direction information. It also sequentially delivers the selected data with its target information.

By analogy, the sorting buffer means also comprises a right-out sorting buffer ROB having two inputs respectively connected to the local and left-in distributor of the right neighboring cell. The right out sorting buffer ROB receives the corresponding data associated with the target and direction information, selecting therefrom data to be delivered to the left-in distributor of the right neighboring cell in accordance with the direction information. It also sequentially delivers the selected data based upon the target information.

Figure 11:
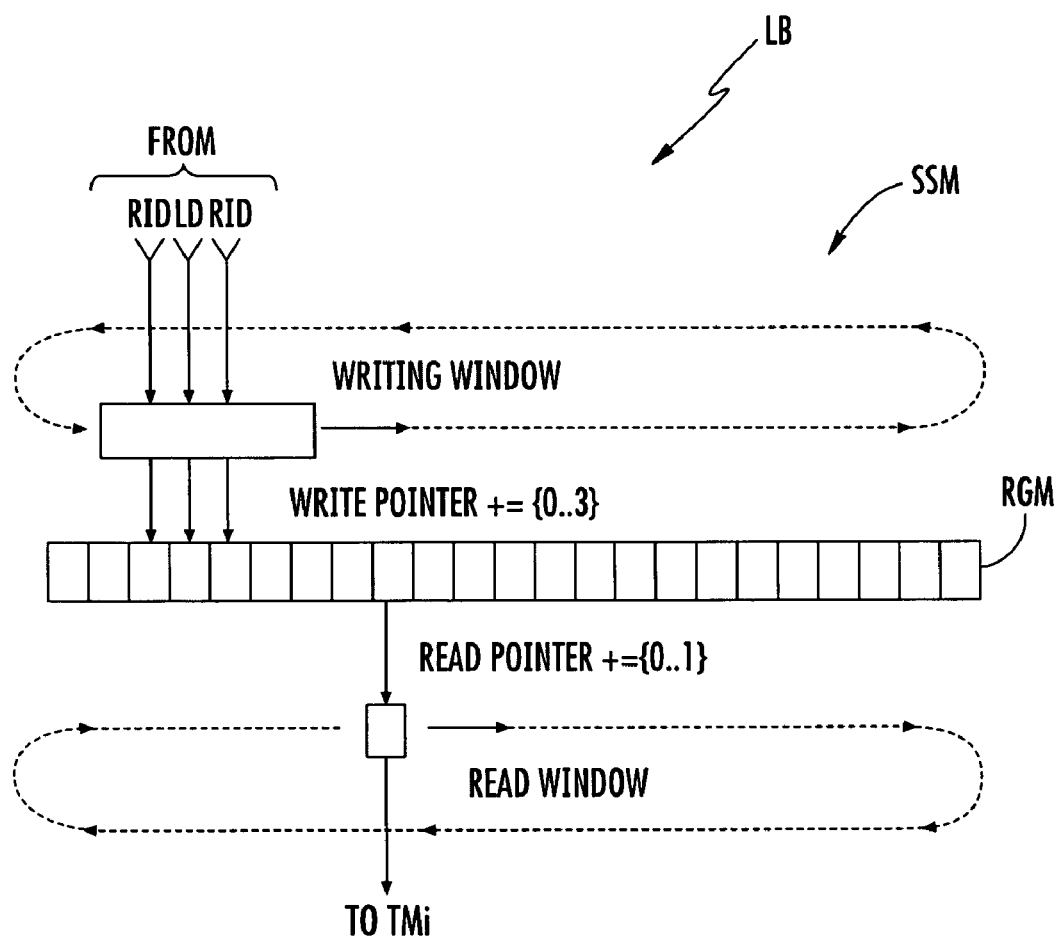
FIGS. 11 and 12 are schematic block diagrams showing in greater detail buffer circuitry incorporated in the electronic device of FIG. 8.
Figure 12:
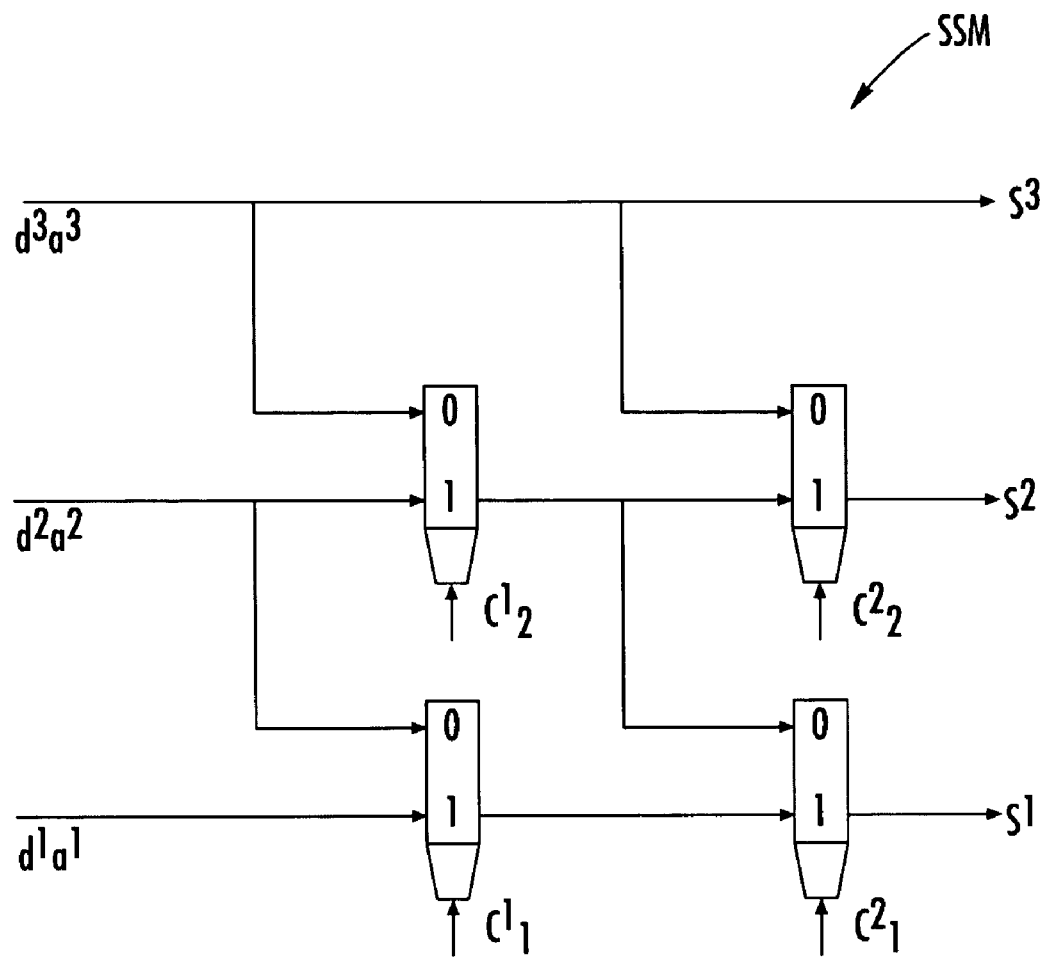

Referring now to FIGS. 11 and 12, and embodiment of the local out buffer LB is now described. As already explained, three sets of data are received on the three inputs of the local out buffer LB. However, none, some, or all of the data sets may require storage in the local target RAM TMi, depending upon their direction information. Further, all of these data sets are received in the same clock cycle. However, only one data set may be stored per cycle in the target RAM TMi.

Thus, such a buffer should be able to store three values and output one value to memory in the same cycle. Such a buffer does not need to support random access. It is implemented as a special register file capable of storing up to three values in parallel. A value is composed here of an LLR-data set and its associated target information, including the associated relative address.

Write and read accesses to a buffer may be modeled with writing windows where values may be stored in registers and reading windows. The writing window includes three registers, the worst case number of concurrent write accesses. Shifting it only by the number of values actually written prevents the creation of "holes" with irrelevant values.

FIG. 12 illustrates diagrammatically one embodiment of the sorting means SMM buffer. The sorting means comprises here two stages of two multiplexers controlled by control signals $C_j^k$. When a control signal takes the value 1, the data which is received at the input 1 of the multiplexer is delivered at the output. By analogy, when a control signal takes the value 0, the data which is received at the input 0 is delivered at the output of the multiplexer.

The sorting means SSM are associated with a referenced direction information for this buffer, for example, the referenced direction information (0,0) for the local out sorting buffer LB. When address data a arrives at the input of the sorting means SSM, its direction information is compared with the referenced direction information. If the direction information is identical, a decision variable rx is associated with the data and takes the value 1, for example. In not, the decision variable rx takes the value 0.

Control means, which may be implemented with logic gates, then generates the control signals as follows:

$C^1_1 = r^1$;
$C^1_2 = r^1$;
$C^2_1 = r^2$ or $r^1$; and
$C^2_2 = r^2$.

Thus, from the inputs, only those which are relevant for this buffer are selected and aligned such that they form an uninterrupted sequence starting from $s^1$, for example. These sorted sequence and the total number of relevant inputs (R) is passed to the register means. The outputs $s^1$ to $S^R$ are stored in the register means RGM. This ensures a continuous filling of the register means RGM with relevant data only.

When reading from the register means RGM, the local address a and the data d are separated again and are used to address the local target RAM accordingly. Of course, an analogous architecture is used for the left-out sorting buffer and the right-out sorting buffer, with the differences that they have only two inputs instead of three.

A parametrisable VHDL model of the electronic device according to the second embodiment of the invention has been developed. Synthesis was carried out using a 0,20 µm standard cell library. Under worst case conditions, a maximum clock frequency of 190 MHz is achieved, whereas state of the art implementations of constituent MAP decoders in this technology are clocked at about 150 MHz.

A turbo decoder system with 16 producers featuring an example of a distributed architecture according to the second embodiment of the invention may be clocked at 150 MHz. Comparing on a throughput basis, one would need, for example, 26 producers at 90 MHz using a tree-like structure as mentioned in the first embodiment of the invention, leading to a total area increase of about 30%.

Generally speaking, the invention is not limited to the particular application of channel decoding using turbo code, but it also applies to LDPC code decoders whose parity check matrix may also be interpreted as multiple interleavers. Further, the architectures according to the invention are not only useful for wireless systems, but for other kinds of communication systems as well including wireline, wireless, routers, etc. Furthermore, the architectures according to the invention may be used for other kinds of interleavers and de-interleavers, like turbo code interleavers/deinterleavers or normal channel interleavers/de-interleavers.

More generally, the invention relates to the storage of multiple data sets produced during one clock cycle into memories which have a number of ports smaller than the number of data sets which are to be stored simultaneously in those memories. The architectures according to the invention may be used for numerous kinds of systems with multiple sources and multiple sinks with a statistically equal access distribution. An equal distribution of the access to the sink leads to a desired implementation.

For non-equally distributed systems the architectures may be somewhat less than desired. Nevertheless, the architectures may still be used with some additional amount of memory.

The invention claimed is:

1. An electronic device comprising:
   a plurality of N elementary source memories having respective source addresses for storing a plurality of N input data sets;
   a processor connected to said source memories and clocked by a clock signal and having a plurality of N outputs for providing, per cycle of the clock signal, a plurality of N output data sets each corresponding to a respective one of the N input data sets and having a respective source address and target address associated therewith;
   a plurality of N target memories each having a respective target address associated therewith;
   a plurality of N interleaving tables for storing a respective target address for each source address; and
   a plurality of N cells connected in a ring, each cell also being connected between a respective output of said processor, a respective interleaving table, and a respective target memory;
   each cell for receiving output data sets from the respective output of said processor and from a plurality of adjacent cells in the ring, and providing at least one of the received output data sets to at least one of said adjacent cells and said respective target memory based upon the respective source and target addresses thereof and said respective interleaving table.

2. The electronic device of claim 1 wherein each cell comprises:
a distributor connected to the respective output of said processor, said respective interleaving table, and to said plurality of adjacent cells, said distributor for generating direction information for the received output data sets based upon respective target addresses thereof; and
a sorting buffer connected to said distributor, said respective target memory, and said plurality of adjacent cells for selecting output data sets from the received output data sets based upon the direction information.

3. The electronic device of claim 2 wherein said plurality of adjacent cells comprise a cell to the left of said cell and a cell to the right of said cell in the ring; and wherein said distributor comprises:
a local distributor connected to the respective output of said processor for generating direction information for output data sets received therefrom; and
left-in and right-in distributors respectively connected to said left and right cells for generating direction information for output data sets received therefrom.

4. The electronic device of claim 3 wherein said sorting buffer comprises a local-out sorting buffer having a respective input connected to said local, left-in, and right-in distributors and to said respective target memory, said local-out sorting buffer for selecting received output data sets to be stored in said respective target memory based upon the respective direction information and sequentially writing said selected output data sets in said respective target memory based upon respective target addresses;
a left-out sorting buffer having respective inputs connected to said local and right-in distributors and to said right-in distributor of said left cell, said left-out sorting buffer for selecting received output data sets to be provided to said right-in distributor of said left cell based upon respective direction information and sequentially providing the selected output data sets thereto along with respective target addresses; and
a right-out sorting buffer having respective inputs connected to said local and left-in distributors and to said left-in distributor of said right cell, said right-out sorting buffer for selecting received output data sets to be provided to said left-in distributor of said right cell based upon respective direction information and sequentially providing the selected output data sets thereto along with respective target addresses.

5. The electronic device of claim 2 wherein said sorting buffer comprises:
a sorter for receiving the plurality of input data sets and having a plurality of N outputs and a control input for receiving direction information, said sorter for selecting input data sets based upon the received direction information and providing the selected input data sets consecutively at the outputs thereof;
a plurality of registers each for storing a selected data set and the respective target address thereof;
a write pointer for writing the selected data sets in consecutive registers; and
a read pointer for sequentially reading said registers.

6. The electronic device of claim 1 wherein said plurality of source memories, said processor, said plurality of N target memories, said plurality of N interleaving tables, and said plurality of N cells are implemented in an integrated circuit.

7. The electronic device of claim 1 wherein said each target memory comprises a single-port memory.

8. The electronic device of claim 1 wherein said processor performs code decoding on the input data sets.

9. The electronic device of claim 8 wherein the code decoding comprises turbo code decoding.

10. The electronic device of claim 1 wherein said processor performs code encoding on the input data sets.

11. The electronic device of claim 10 wherein the code encoding comprises turbo code encoding.

12. The electronic device of claim 1 wherein said processor performs interleaving on the input data sets.

13. The electronic device of claim 1 wherein said processor performs de-interleaving on the input data sets.

14. A method for using an electronic device comprising a plurality of N elementary source memories having respective source addresses for storing a plurality of N input data sets, a processor connected to the source memories and clocked by a clock signal and having a plurality of N outputs for providing, per cycle of the clock signal, a plurality of N output data sets each corresponding to a respective one of the N input data sets and having a respective source address and target address associated therewith, a plurality of N target memories each having a respective target address associated therewith, a plurality of N interleaving tables for storing a respective target address for each source address, and a plurality of N cells connected in a ring, each cell also being connected between a respective output of the processor, a respective interleaving table, and a respective target memory, the method comprising, at each cell:
receiving output data sets from the respective output of the processor and from a plurality of adjacent cells in the ring; and
based upon respective source and target addresses and the respective interleaving table, providing at least one of the received output data sets to at least one of the adjacent cells and the respective target memory.

15. The method of claim 14 wherein each cell comprises:
a distributor connected to the respective output of the processor, the respective interleaving table, and to the plurality of adjacent cells, the distributor for generating direction information for the received output data sets based upon respective target addresses thereof; and
a sorting buffer connected to the distributor, the respective target memory, and the plurality of adjacent cells for selecting output data sets from the received output data sets based upon the direction information.

16. The method of claim 14 wherein the plurality of adjacent cells comprise a cell to the left of the cell and a cell to the right of the cell in the ring; and
wherein the distributor comprises:
a local distributor connected to the respective output of the processor for generating direction information for output data sets received therefrom; and
left-in and right-in distributors respectively connected to the left and right cells for generating direction information for output data sets received therefrom.

17. The method of claim 14 further comprising using the processor to perform at least one of coding and decoding on the input data sets.

18. The method of claim 17 wherein the decoding comprises turbo code decoding, and wherein the encoding comprises turbo code encoding.

19. The method of claim 14 further comprising using the processor to perform at least one of interleaving and de-interleaving on the input data sets.

* * * * *

UNITED STATES PATENT AND TRADEMARK OFFICE
CERTIFICATE OF CORRECTION

PATENT NO. : 7,386,691 B2
APPLICATION NO. : 11/104836
DATED : June 10, 2008
INVENTOR(S) : Friedbert Berens et al.

It is certified that error appears in the above-identified patent and that said Letters Patent is hereby corrected as shown below:

| | |
|---|---|
| Column 5, Line 29 | Delete: "cells They"<br>Insert: --cells. They-- |
| Column 8, Line 23 | Delete: "Departement"<br>Insert: --Department-- |
| Column 10, Line 12 | Delete: "Cli"<br>Insert: --CLi-- |
| Column 10, Line 55 | Delete: "r."<br>Insert: --$r^2$.-- |
| Column 11, Line 49 | Delete: "ILTI"<br>Insert: --ILTi-- |
| Column 12, Line 36 | Delete: "Cli"<br>Insert: --CLi-- |
| Column 13, Line 52 | Delete: "rx"<br>Insert: --$r^x$-- |
| Column 13, Line 53 | Delete: "In"<br>Insert: --If-- |
| Column 13, Line 54 | Delete: "rx"<br>Insert: --$r^x$-- |
| Column 13, Line 63 | Delete: "These"<br>Insert: --This-- |
| Column 13, Line 65 | Delete: "$S^R$"<br>Insert: --$s^R$-- |

UNITED STATES PATENT AND TRADEMARK OFFICE
CERTIFICATE OF CORRECTION

PATENT NO. : 7,386,691 B2
APPLICATION NO. : 11/104836
DATED : June 10, 2008
INVENTOR(S) : Friedbert Berens et al.

It is certified that error appears in the above-identified patent and that said Letters Patent is hereby corrected as shown below:

Column 14, Line 9  Delete: "0,20"
                   Insert: --0.20--

Signed and Sealed this

Twenty-eighth Day of October, 2008

JON W. DUDAS
*Director of the United States Patent and Trademark Office*